(12) United States Patent
Boehm et al.

(10) Patent No.: US 11,775,385 B2
(45) Date of Patent: *Oct. 3, 2023

(54) TARGETED COMMAND/ADDRESS PARITY LOW LIFT

(71) Applicant: Micron Technology, Inc., Boise, ID (US)

(72) Inventors: Aaron P. Boehm, Boise, ID (US); Scott E. Schaefer, Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/580,284

(22) Filed: Jan. 20, 2022

(65) Prior Publication Data

US 2022/0147419 A1 May 12, 2022

Related U.S. Application Data

(63) Continuation of application No. 17/216,418, filed on Mar. 29, 2021, now Pat. No. 11,249,847.

(60) Provisional application No. 63/007,702, filed on Apr. 9, 2020.

(51) Int. Cl.
| | |
|---|---|
| *G06F 11/10* | (2006.01) |
| *H03M 13/29* | (2006.01) |
| *G11C 11/408* | (2006.01) |
| *G11C 11/4091* | (2006.01) |
| *G11C 11/22* | (2006.01) |

(52) U.S. Cl.
CPC ..... *G06F 11/1068* (2013.01); *H03M 13/2906* (2013.01); *G11C 11/221* (2013.01); *G11C 11/4087* (2013.01); *G11C 11/4091* (2013.01)

(58) Field of Classification Search
None
See application file for complete search history.

(56) References Cited

U.S. PATENT DOCUMENTS

| 2009/0319840 A1* | 12/2009 | Hara | G06F 11/1068 |
| | | | 714/E11.169 |
| 2013/0024744 A1* | 1/2013 | Takizawa | G06F 11/10 |
| | | | 714/763 |
| 2013/0139032 A1* | 5/2013 | Tsern | G06F 3/0673 |
| | | | 714/764 |

(Continued)

FOREIGN PATENT DOCUMENTS

KR 20170034224 A 3/2017

OTHER PUBLICATIONS

"RP 2006:2006—SMPTE Recommended Practice—Solid State Media (SSM) Card Specification," in RP 2006:2006, vol. No. pp. 1-46, Sep. 15, 2006, doi: 10.5594/SMPTE.RP2006.2006. (Year: 2006).*

(Continued)

*Primary Examiner* — Daniel F. McMahon
(74) *Attorney, Agent, or Firm* — Holland & Hart LLP

(57) ABSTRACT

Methods, systems, and devices for targeted command/address parity low lift are described. A memory device receives a command (e.g., a write command or a read command) from a host device over a first set of pins and performs data transfer over a second set of pins with the host device according to the command. The memory device exchanges a first parity bit associated with the command with the host device, and generates a second parity bit based on the command. A parity result bit is subsequently generated based, at least in part, on the first parity bit and the second parity bit.

20 Claims, 10 Drawing Sheets

(56) References Cited

U.S. PATENT DOCUMENTS

| | | | |
|---|---|---|---|
| 2013/0275830 A1* | 10/2013 | Park | H03M 13/09 |
| | | | 714/758 |
| 2014/0122974 A1 | 5/2014 | Yun | |
| 2017/0004035 A1* | 1/2017 | Suh | G11C 29/52 |
| 2017/0060682 A1 | 3/2017 | Kodera et al. | |
| 2017/0242585 A1* | 8/2017 | Eguchi | G06F 3/0619 |
| 2019/0165808 A1 | 5/2019 | Yu et al. | |
| 2019/0205248 A1* | 7/2019 | Hsieh | G06F 3/0679 |
| 2019/0340067 A1 | 11/2019 | Kim et al. | |
| 2020/0278908 A1* | 9/2020 | Schaefer | G06F 11/1012 |

OTHER PUBLICATIONS

J. Kim, M. Sullivan, S. Lym and M. Erez, "All-Inclusive ECC: Thorough End-to-End Protection for Reliable Computer Memory," 2016 ACM/IEEE 43rd Annual International Symposium on Computer Architecture (ISCA), Seoul, Korea (South), 2016, pp. 622-633, doi: 10.1109/ISCA.2016.60. (Year: 2016).*

S Seo et al., "Design and implementation of a mobile storage leveraging the DRAM interface," 2016 IEEE International Symposium on High Performance Computer Architecture (HPCA), 2016, pp. 531-542, doi 10.1109/HPCA.2016.7446092. (Year: 2016).

ISA/KR, International Search Report and Written Opinion of the International Searching Authority, Int'l. Appl. No. PCT/US2021/024870, dated Jul. 16, 2021, Korean Intellectual Property Office, Seo-gu, Daejeon, Republic of Korea,8 pgs.

* cited by examiner

TARGETED COMMAND/ADDRESS PARITY LOW LIFT

CROSS REFERENCE

The present Application for Patent is a continuation of U.S. patent application Ser. No. 17/216,418 by BOEHM et al., entitled "TARGETED COMMAND/ADDRESS PARITY LOW LIFT," filed Mar. 29, 2021, which claims the benefit of U.S. Provisional Patent Application No. 63/007,702 by BOEHM et al., entitled "TARGETED COMMAND/ADDRESS PARITY LOW LIFT," filed Apr. 9, 2020, each of which is assigned to the assignee hereof, and each of which is expressly incorporated by reference herein.

BACKGROUND

The following relates generally to one or more memory systems and more specifically to targeted command/address parity low lift.

Memory devices are widely used to store information in various electronic devices such as computers, wireless communication devices, cameras, digital displays, and the like. Information is stored by programing memory cells within a memory device to various states.

For example, binary memory cells may be programmed to one of two supported states, often denoted by a logic 1 or a logic 0. A single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

In some cases, it may be desirable for a memory device or a host device to perform parity checking on command/address (CA) pins. However, in some cases, using a pin dedicated to performing CA parity may not be feasible or practical (e.g., due to constraints on a quantity of pins of a memory device, host device, or a bus interface between the host device and the memory device). In addition, timing constraints for detecting or outputting a parity check result may be different for various applications. In some cases, it may be sufficient to convey a relatively low number of bits (e.g., a single bit) for CA parity, either generated and input from a host device to the memory device for checking, or output from the memory device for checking by a host device.

To convey the CA parity information without using a pin dedicated to performing CA parity, the memory device, concurrently with or subsequent to receiving a command, may use cycles of data-associated pins such as data mask/invert (DMI), error correction code (ECC), or redundant data strobe (RDQS) unused for the command to convey parity information. In some cases, such pins may be used for other functions during other data cycles associated with the command. In one example, if the memory device receives a write command, the host device may convey a parity bit to the memory device via a pin for ECC and/or RDQS. In another example, if the memory device receives a read command, the memory device may output a result of a parity check for one or more write commands, or convey a parity bit for the read commend to the host device via a pin for ECC and/or DMI. If the pins for conveying the parity bit are input pins for a given command, parity information may be received by the memory device over the pin. In such cases, the parity check may be logged in a register of the memory device. If the pins for conveying the parity bit are output pins for a given command, parity information may be output by the memory device for checking by the host.

Features of the disclosure are initially described in the context of memory systems and dies as described with reference to FIGS. 1 and 2. Features of the disclosure are described in the context of timing diagrams as described with reference to FIGS. 3A-4C. These and other features of the disclosure are further illustrated by and described with reference to an apparatus diagram and flowcharts that relate to targeted command/address parity low lift as described with references to FIGS. 5-7.

Figure 1:
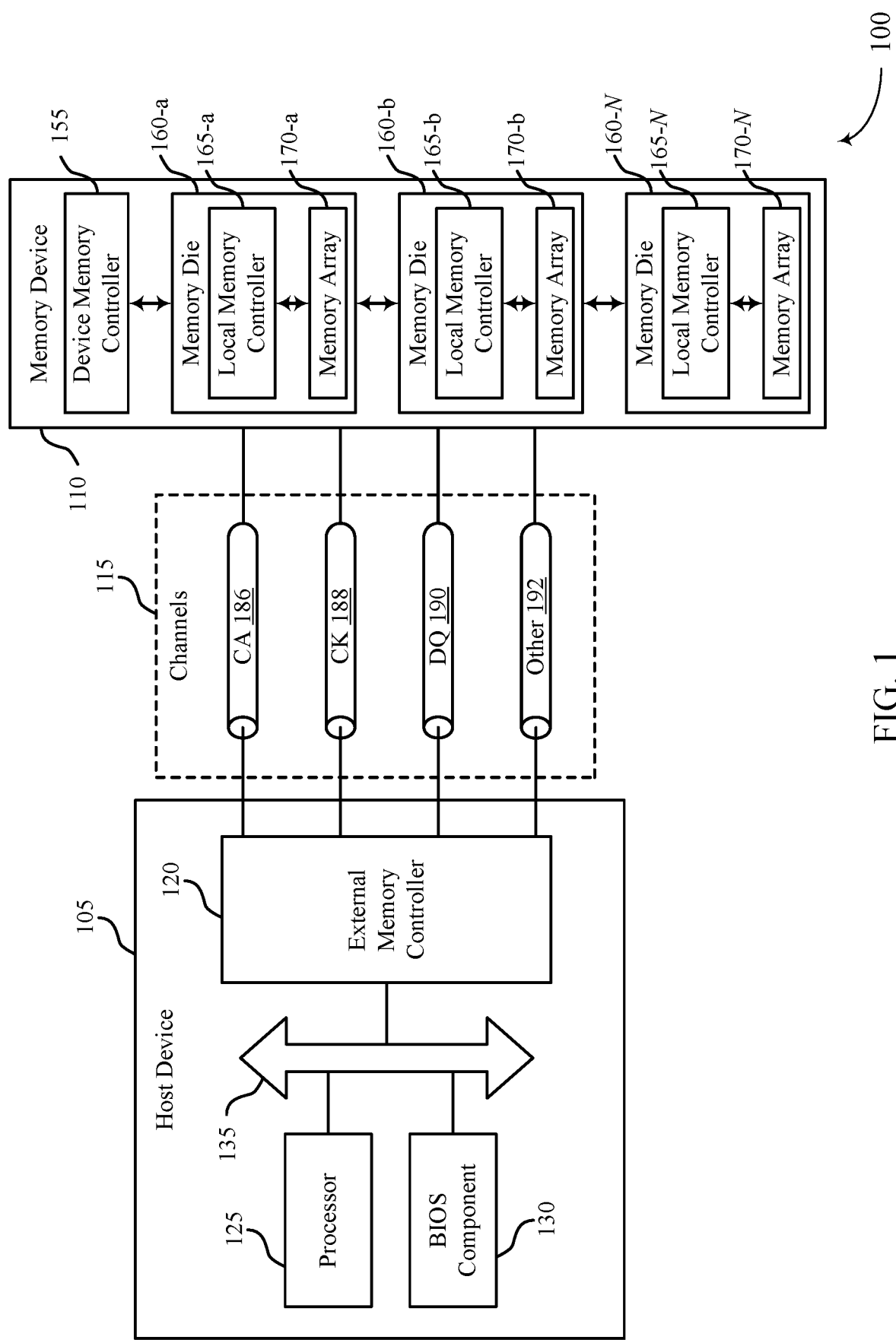
FIG. 1 illustrates an example of a system that supports targeted command/address parity low lift in accordance with examples as disclosed herein.

FIG. 1 illustrates an example of a system 100 that supports targeted command/address parity low lift in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a graphics processing unit (GPU), a computer, a laptop computer, a tablet computer, a smartphone, a cellular phone, a wearable device, an internet-connected device, a vehicle controller, or some other stationary or portable electronic device, among other examples. The host device 105 may refer to the hardware, firmware, software, or a combination thereof that implements the functions of an external memory controller 120. The external memory controller 120 may be referred to as a host or a host device 105.

A memory device 110 may be an independent device or a component that is operable to provide physical memory addresses/space that may be used or referenced by the system 100. A memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. The memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. The external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. The device memory controller 155 may control operation of the memory device 110 described herein in conjunction with the local memory controller 165 of the memory die 160.

The memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may be operable to control operation of the memory die 160. A local memory controller 165 may be operable to communicate (e.g., receive or transmit data or commands or both) with the device memory controller 155. A memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. The external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. Information (e.g., modulation symbols) may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

CA channels 186 may be operable to communicate commands between the host device 105 and the memory device 110 including control information associated with the commands (e.g., address information). For example, the CA channel 186 may include a read command with an address of the desired data. CA channel 186 may include any quantity of signal paths to decode one or more of address or command data (e.g., eight or nine signal paths).

Clock signal channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. The clock signal may be single ended. The clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

Data channels 190 may be operable to communicate one or more of data or control information between the host device 105 and the memory device 110. For example, the data channels 190 may communicate information (e.g., bi-directional) to be written to the memory device 110 or information read from the memory device 110.

The channels 115 may include any quantity of signal paths (including a single signal path). A channel 115 may include multiple individual signal paths. For example, a channel may be ×4 (e.g., including four signal paths), ×8 (e.g., including eight signal paths), ×16 (including sixteen signal paths), etc.

The one or more other channels 192 may include one or more error detection code (EDC) channels. The EDC channels may be operable to communicate error detection signals, such as checksums, to improve system reliability. The one or more other channels 192 may include one or more RDQS channels. The RDQS channels may be operable to communicate redundant data strobe signaling associated with data transmitted by the memory device 110 for a read command. The one or more other channels 192 may include one or more DMI channels. The DMI channels may be operable to communicate data mask or invert signaling associated with data transmitted by the host device 105 for a write command. An EDC, RDQS, or DMI channel may include any quantity of signal paths.

In some cases, it may be desirable to perform parity checking on CA pins associated with a CA channel 186. However, in some cases, using a channel or pin dedicated to performing CA parity may not be feasible or practical. In addition, timing constraints for detecting or outputting a parity check result may be different for various applications (e.g., relaxed for some applications). Thus, it may be sufficient to convey a single bit for CA parity, either generated and input from a host device 105 to the memory device 110 for checking, or output from the memory device 110 for checking by a host device 105. In addition, a single bit CA parity check result may be output by the memory device 110 without using a dedicated pin.

To convey the single bit without using a pin dedicated to performing CA parity, the host device 105 or memory device 110, when transmitting or receiving a command, may use cycles of data-associated pins such as DMI, ECC, or RDQS unused for the command to convey parity information. In one example, a memory device 110 may receive a write command over a CA channel 186 and corresponding data over a data channel 190. Additionally, the memory device 110 may receive a data mask signal over one or more DMI pins that corresponds to the data. In some cases, the memory device 110 may receive an ECC for the data, the data mask signal, or both over a RDQS pin (e.g., RDQS_t). However, during at least one cycle unused for receiving ECC, the host device 105 may transmit a parity bit for the write command over the RDQS pin to the memory device 110. In some cases, CA parity may be performed when a particular register of the memory device 110 is enabled.

In another example the memory device 110 receives a read command over a CA channel 186 and may transmit corresponding data over a data channel 190. Additionally, the memory device may transmit a redundant strobe signal over one or more RDQS pins that correspond to the data. In some cases, the memory device 110 may transmit an ECC for the data, an indication of a data set function, or both over a DMI pin. However, during at least one cycle unused for transmitting ECC, the indication of the data set function, or both, the memory device 110 may transmit a result of a parity check for the CA channel 186 for one or more prior write commands, or a parity bit generated for the CA channel 186 for the read command over the DMI pin to the host device 105.

Figure 2:
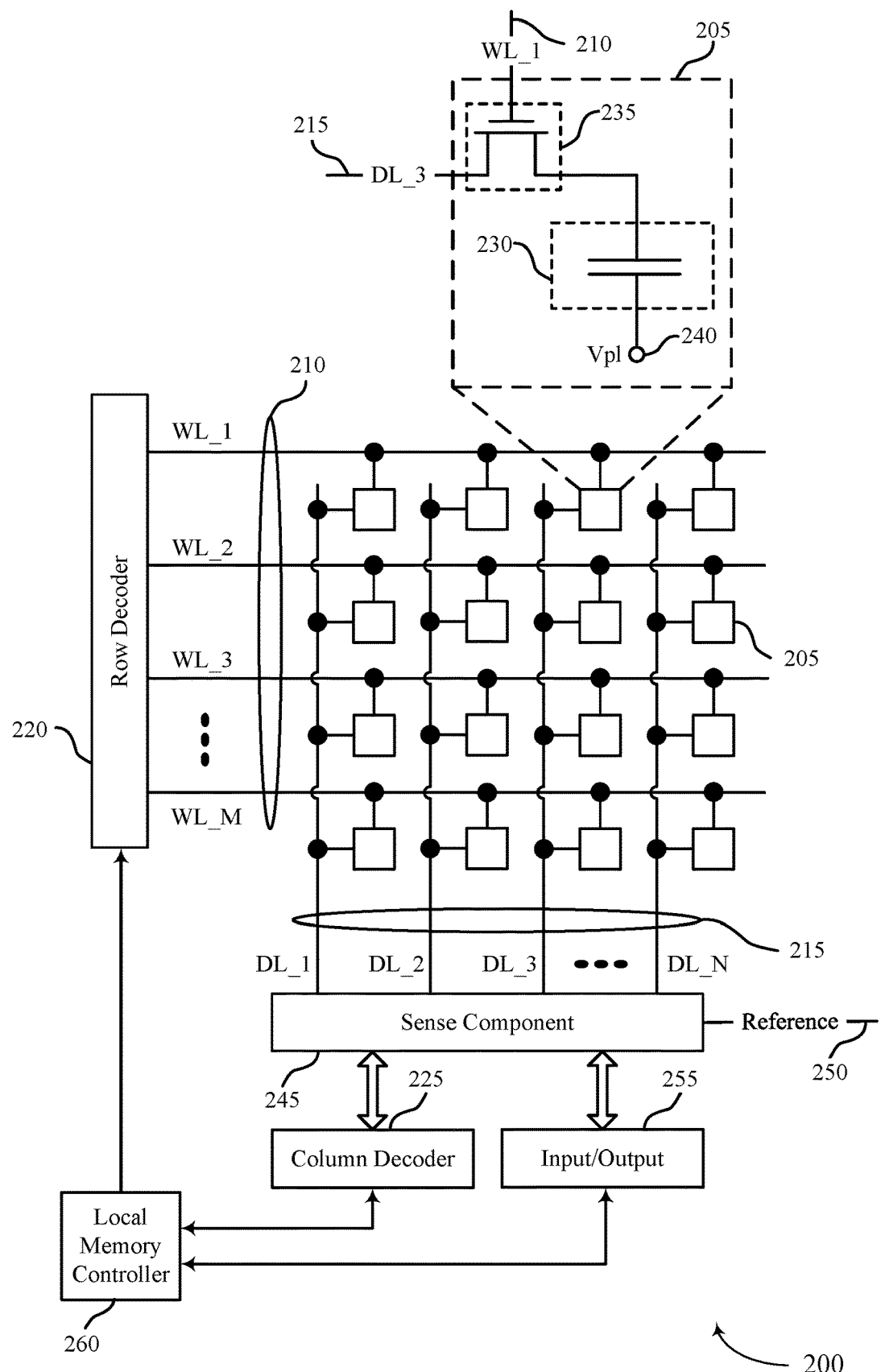
FIG. 2 illustrates an example of a memory die that supports targeted command/address parity low lift in accordance with examples as disclosed herein.

FIG. 2 illustrates an example of a memory die 200 that supports targeted command/address parity low lift in accordance with examples as disclosed herein. The memory die 200 may be an example of the memory dies 160 described with reference to FIG. 1. The memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). A memory cell 205 (e.g., a multi-level memory cell) may be operable to store more than one bit of information at a time (e.g., a logic 00, logic 01, logic 10, a logic 11). The memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. word lines 210 may be referred to as row lines. Digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. One or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired logic state. The local memory controller 260 may identify a target memory cell 205 on which to perform the write operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The local memory controller 260 may apply a specific signal (e.g., write pulse) to the digit line 215 during the write operation to store a specific state (e.g., charge) in the capacitor 230 of the memory cell 205. The pulse used as part of the write operation may include one or more voltage levels over a duration.

The local memory controller 260 may be operable to perform a read operation (e.g., a sense operation) on one or more memory cells 205 of the memory die 200. During a read operation, the logic state stored in a memory cell 205 of the memory die 200 may be determined. The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference 250. Based on that comparison, the sense component 245 may determine a logic state that is stored on the memory cell 205.

In some cases, performing a write operation may involve receiving a parity bit from a host device 105; generating a parity bit based on a write command that triggered the write operation; and comparing the received parity bit with the generated parity bit. The result may be stored in a register (e.g., a master error register). Performing a read operation, meanwhile, may involve transmitting parity information to the host device 105 via a channel also used for additional data associated functions, if enabled, during output of the data for the read operation. For example, the parity information may include a parity check result associated with a CA channel from one or more prior write operations, or a parity bit generated by the memory device based on a read command that triggered the read operation. It should be noted that there may be instances where multiple parity bits or parity information may be received or generated. For example, each of multiple parity bits may cover portions of the CA channel, or multiple bits of parity information may be generated from the CA channel. Multiple parity bits may be received via a channel multiplexed for data associated functions for a write operation or generated and sent on the multiplexed channel based on a read command.

Figure 3A:
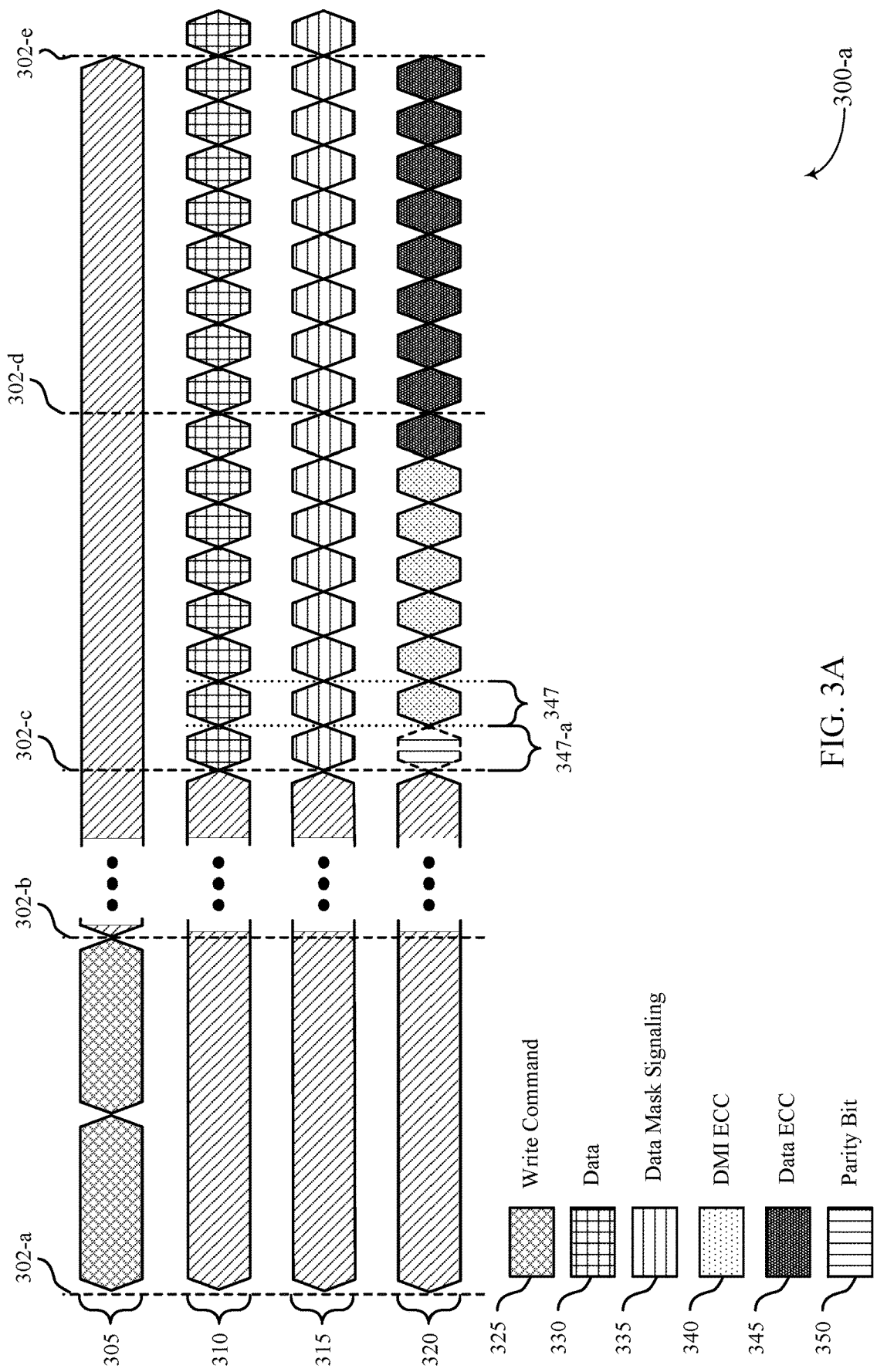
FIGS. 3A and 3B illustrate examples of timing diagrams that support targeted command/address parity low lift in accordance with examples as disclosed herein.
Figure 3B:
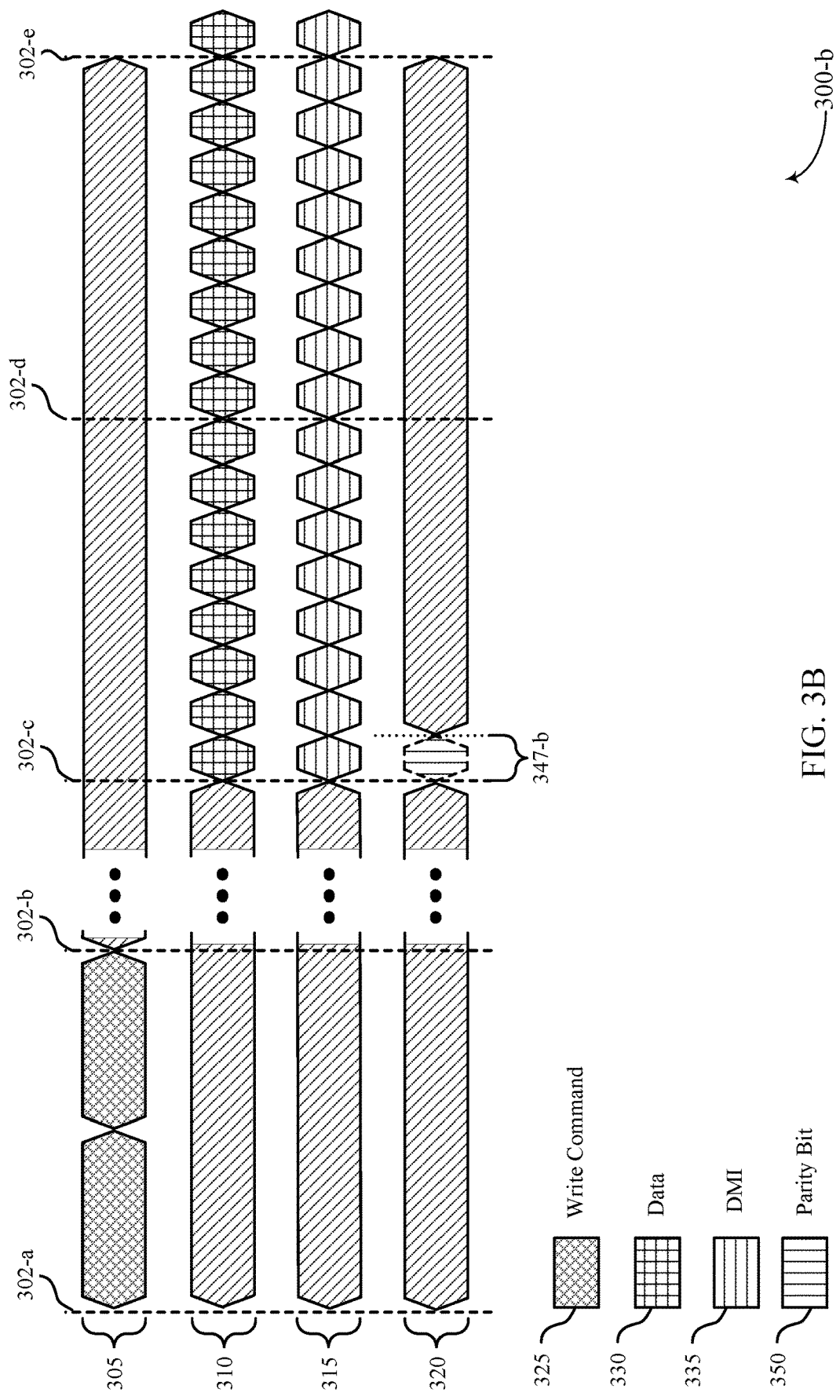

FIGS. 3A and 3B illustrate examples of timing diagrams 300-a and 300-b that support targeted command/address parity low lift in accordance with examples as disclosed herein. FIGS. 3A and 3B may depict transmission of a parity bit for a write command.

Timing diagrams 300-a and 300-b may show timing for a CA channel 305, a DQ channel 310, a DMI channel 315, and a multi-purpose channel 320. For example, CA channel 305, DQ channel 310, DMI channel 315, and multi-purpose channel 320 may correspond to a CA channel 186, a DQ channel 190, a DMI channel, and a multi-purpose channel, respectively. In some cases, an interface between a host device 105 and a memory device 110 (e.g., including CA channel 305, a DQ channel 310, a DMI channel 315, and multi-purpose channel 320) may not include a dedicated parity pin or channel. For example, even where memory device 110 may support a dedicated parity pin for CA parity, the interface between the host device 105 and the memory device 110 may not include a channel or bus line associated with the parity pin (e.g., based on size or other constraints for the system including the host device 105 and the memory device 110). The multi-purpose channel may be an RDQS channel, an ECC channel, or both. Each channel may be associated with a respective set of pins. In the present example, the pins associated with the multi-purpose channel may be input pins during data transfer (e.g., may carry information from a host device 105 to a memory device 110). Timing diagram 300-a illustrates channels 305, 310, 315, and 320 across multiple timing boundaries 302, where the timing boundaries 302 may be relative to a clock of the memory device 110 (e.g., one timing boundary 302 per one or per multiple clock cycle(s)). In some cases, a memory device may be configurable to receive parity information for the CA channel 305 over a dedicated pin, or over multi-purpose channel 320.

Between timing boundary 302-a and timing boundary 302-b, a memory device 110 may receive a write command 325 from a host device 105 over CA channel 305. The write command 325 may indicate to memory device 110 that memory device 110 is to receive data from the host device 105 and to store the data at the memory device 110. The write command 325 may include a state of the CA channel 305 indicating a write command and an address for storing data associated with the write command. The write command 325 may be received over one or more clock cycles (e.g., the CA channel 305 may be strobed one or more times) between timing boundary 302-a and timing boundary 302-b.

At timing boundary 302-c, the memory device 110 may begin to receive data 330 corresponding to the write command 325 from the host device 105 over DQ channel 310. Additionally, the memory device 110 may begin to receive data mask signaling 335 over DMI channel 315 that corresponds to the data 330. The data 330 and the data mask signaling 335 may be received over a duration that spans multiple timing boundaries 302 (e.g., timing boundaries 302-c, 302-d, 302-e, where the duration between timing boundary 302-c and 302-e may represent a burst length for the write command). Each bit of data or of the data mask signaling may be received over a respective time interval 347. Each time interval 347 may represent a clock cycle or a portion of a clock cycle (e.g., half of a clock cycle), where the clock for the time interval 347 may be different from the clock for the timing boundaries 302.

In some cases, the memory device 110 may receive DMI ECC 340 and data ECC 345 over the multi-purpose channel 320 during a time that at least partially overlaps with receiving the data mask signaling 335 and the data 330, respectively. DMI ECC 340 may represent an error correction code for data mask signaling 335 and data ECC 345 may represent an error correction code for data 330. Each bit of DMI ECC 340 and data ECC 345 may be received over a respective time interval 347.

In some cases, multi-purpose channel 320 may include an unused time interval 347-a, which may be referred to as a bit space (e.g., UI0). The unused time interval 347-a may be a time interval undedicated to exchanging information associated with the data 330 or the data mask signaling 335. In some cases, the host device 105 may transmit a parity bit 350 for the write command 325 in the unused time interval 347-a. In cases where a first portion of the write command 325 is received over a first subset of the set of pins associated with CA channel 305 for receiving a command and a second portion of the write command 325 is received over a second subset of the set of pins associated with the CA channel 305 for receiving an address, the parity bit 350 may be for the first portion of the write command 325, the second portion of the write command 325, or both.

The memory device 110 may use the write command 325 to generate another parity bit. The memory device 110 may compare the received parity bit 350 with the generated parity bit. If the two parity bits match, the memory device 110 may determine that the write command 325 was received correctly. However, if the two parity bits do not match, the memory device 110 may determine that the write command 325 was not correctly received. The memory device 110 may store the result of the comparing in a register.

After receiving the data burst, the memory device 110 may provide signaling indicating whether parity is detected. For instance, a low or high-zero (Z) on a defined signal path may indicate that no parity is detected. A high on the defined signal path may indicate parity is detected. The time from parity occurrence to parity detected, the time from parity detected until signal to the host device 105, and the time from parity detected until a register is logged may be relaxed. For instance, as long as the parity check result is available in the register by the end of the data burst, the timing constraints may be met. Additionally or alternatively, as long as the signal to host device 105 is output prior to receiving a next command or a data burst associated with the next command, timing constraints for output of the parity check result may be met. The low lift parity check may occur on write commands. In such cases, RDQS_t and/or DMI pins may support a parity bit 350 when coupled with link ECC being enabled. The memory device 110 may receive the parity bit 350 over a pin for a lower byte, a pin for an upper byte, or both.

In some cases, as demonstrated in FIG. 3B, the multi-purpose channel may not carry DMI ECC 340 and/or data ECC 345 (e.g., due to link ECC being disabled, whereas link ECC may be enabled for FIG. 3A). However, the multi-purpose channel may be used for other functions (e.g., for RDQS signaling when the memory device 110 receives a read command). Additionally, in such cases, an unused time interval 347-b for the write command may still be present. In such cases, the host device 105 may transmit the parity bit 350 for the write command 325 as described herein.

Figure 4A:
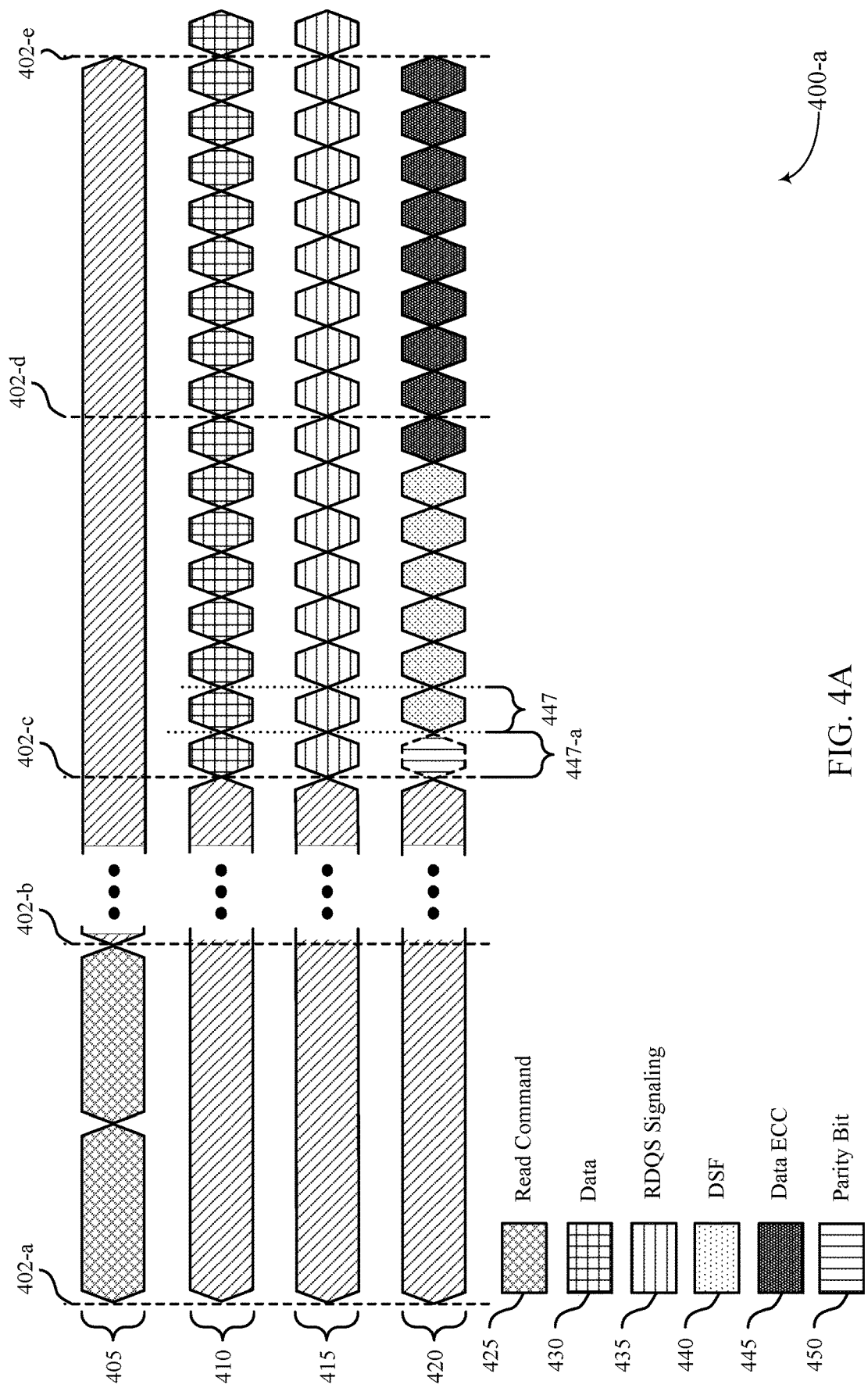
FIGS. 4A, 4B, and 4C illustrate examples of timing diagrams that support targeted command/address parity low lift in accordance with examples as disclosed herein.
Figure 4B:
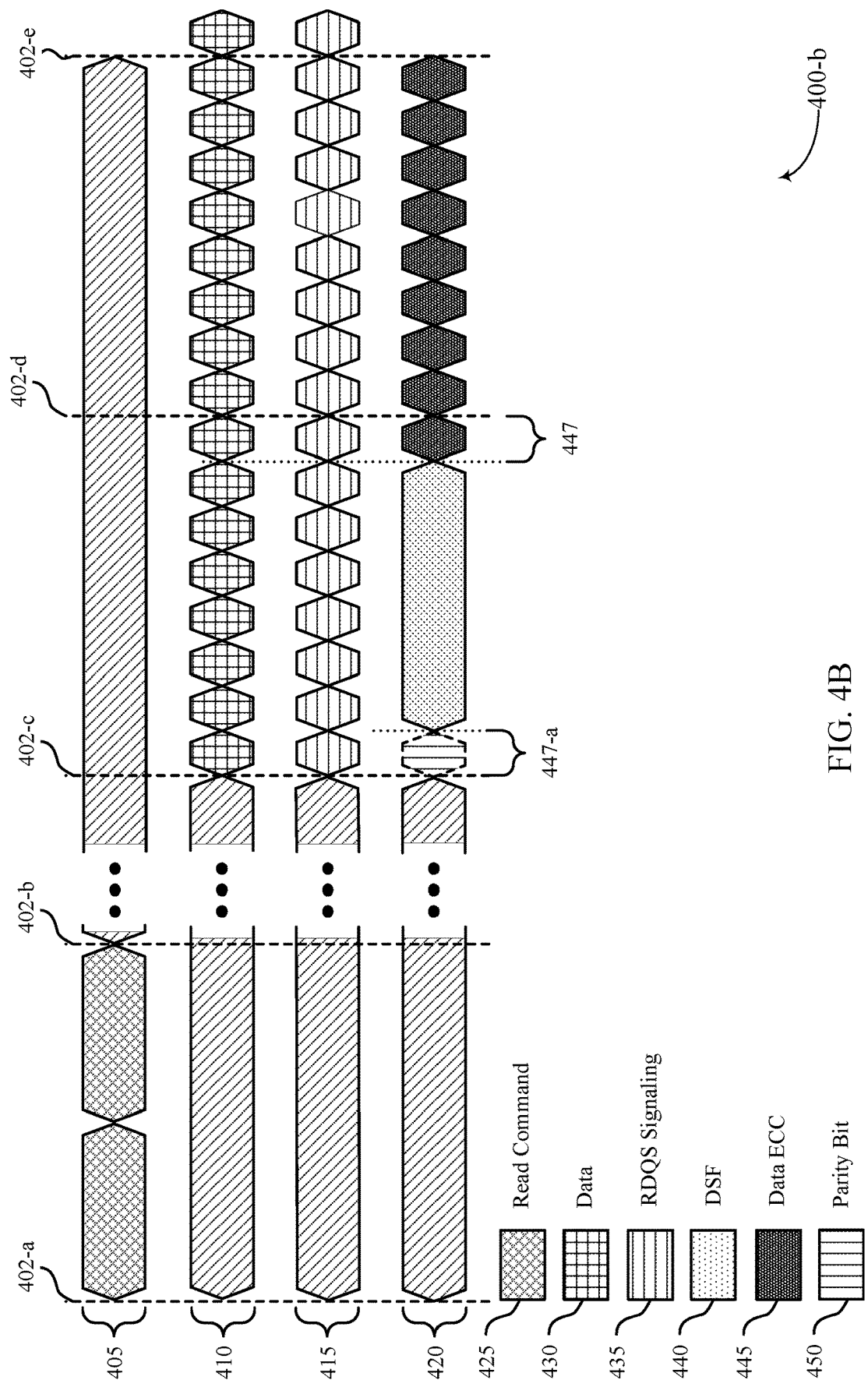
Figure 4C:
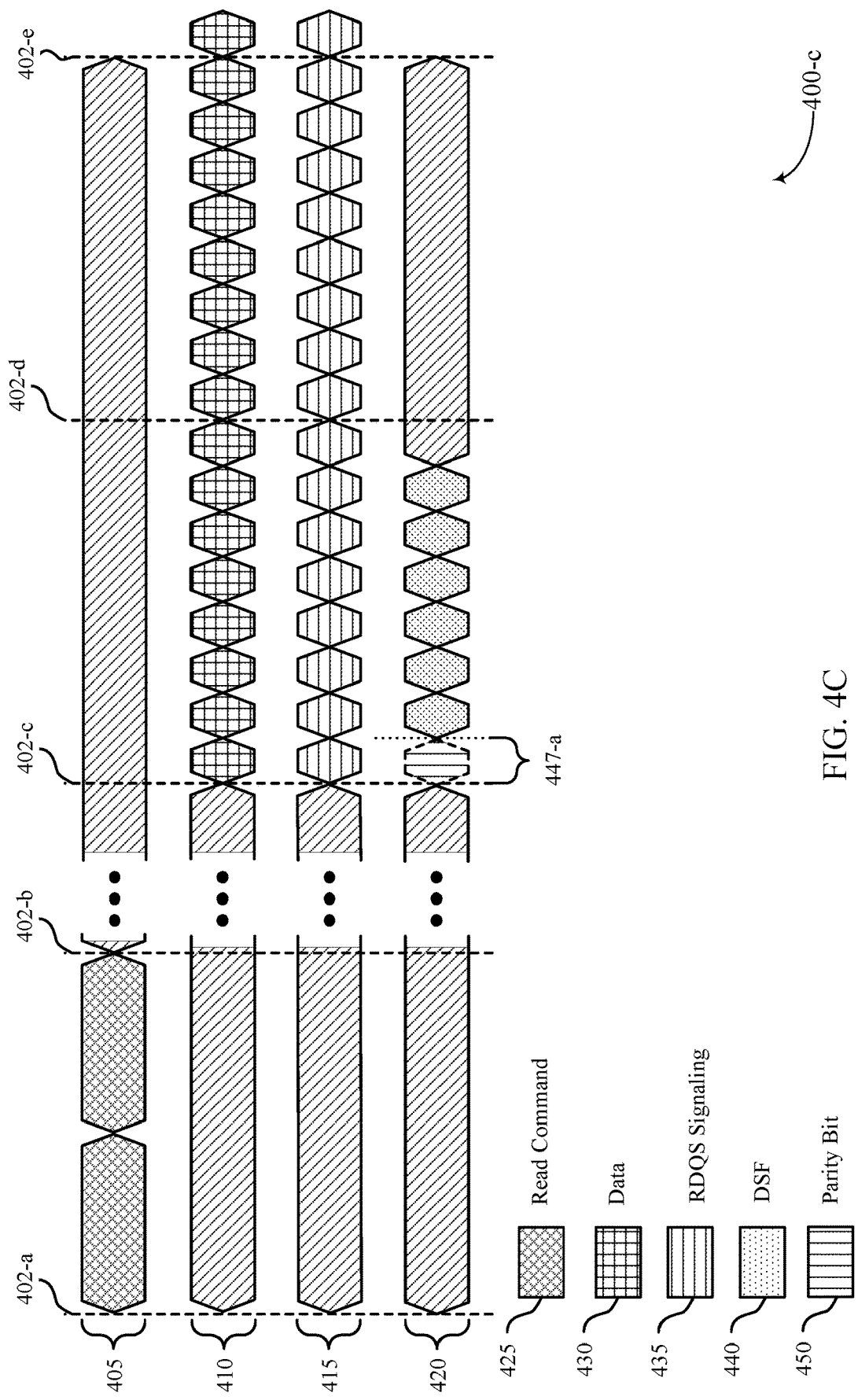

FIGS. 4A, 4B, and 4C illustrate examples of timing diagrams 400-a, 400-b, and 400-c that support targeted command/address parity low lift in accordance with examples as disclosed herein. FIGS. 4A, 4B, and 4C may depict transmission of a parity bit for a read command.

Timing diagrams 400-a, 400-b, and 400-c may illustrate timing of a read command for a CA channel 405, a DQ channel 410, an RDQS channel 415, and a multi-purpose channel 420. CA channel 405, DQ channel 410, RDQS channel 415, and multi-purpose channel 420 may represent correspond to a CA channel 186, a DQ channel 190, a RDQS channel, and a multi-purpose channel, respectively. The multi-purpose channel may be a DMI channel, an ECC channel, or both. Each channel may be associated with a respective set of pins. In some cases, an interface between a host device 105 and a memory device 110 (e.g., including CA channel 405, a DQ channel 410, an RDQS channel 415, and multi-purpose channel 420) may not include a dedicated parity pin or channel. For example, even where memory device 110 may support a dedicated parity pin for CA parity, the interface between the host device 105 and the memory device 110 may not include a channel or bus line associated with the parity pin (e.g., based on size or other constraints for the system including the host device 105 and the memory device 110). In the present example, the pins associated with the multi-purpose channel may be output pins during data transfer (e.g., may carry information from a memory device 110 to a host device 105). Timing diagram 400-a illustrates channels 405, 410, 415, and 420 across multiple timing boundaries 402, where the timing boundaries 402 may be relative to a clock of the memory device 110 (e.g., one timing boundary 402 per one or per multiple clock cycle(s)). In some cases, a memory device may be configurable to output parity information for the CA channel 405 over a dedicated pin, or over multi-purpose channel 420.

Between timing boundary 402-a and 402-b, a memory device 110 may receive a read command 425 from a host device 105 over CA channel 405. The read command 425 may indicate to memory device 110 that memory device 110 is to transmit data to the host device 105. The read command 425 may include a state of the CA channel 405 indicating a read command and an address for retrieving data associated with the read command 425. The read command 425 may be received over one or more clock cycles (e.g., the CA channel 405 may be strobed one or more times) between timing boundary 402-a and timing boundary 402-b.

At timing boundary 402-c, the memory device 110 may begin to transmit data 430 corresponding to the read command 425 to the host device 105 over DQ channel 410. Additionally, the memory device 110 may begin to transmit RDQS signaling 435 over a RDQS channel 415 that corresponds to the data 430. The data 430 and the RDQS signaling 435 may be received over a duration that spans multiple timing boundaries 402 (e.g., timing boundaries 402-c, 402-d, 402-e, where the duration between timing boundary 402-c and 402-e may represent a burst length for the write command). Each bit of data 430 or of the RDQS signaling 435 may be received over a respective time interval 447. Each time interval 447 may represent a clock cycle or a portion of a clock cycle (e.g., half of a clock cycle), where the clock for the time interval 447 may be different from the clock for the timing boundaries 402.

In some cases, the memory device 110 may receive data set function (DSF) signaling 440 and data ECC 445 over the multi-purpose channel 420 during a time that at least partially overlaps with transmitting or outputting the RDQS signaling 435 and the data 430, respectively. The DSF signaling 440 may provide an indication of a data set function associated with the data 430 and the data ECC 445 may provide an indication of an error correction code for the data 430. Each bit of DSF signaling 440 and data ECC 445 may be transmitted or outputted over a respective time interval 447.

In some cases, multi-purpose channel 420 may include an unused time interval 447-a of the time intervals used for the DSF signaling 440 and data 430 signaling for the read command, which may be referred to as a bit space (e.g., UI0). The unused time interval 447-a may be a time interval undedicated to exchanging information associated with the data 430 or the RDQS signaling 435 for the multi-purpose channel 420. The unused time interval 447-a may be used for parity bit 450 related to parity information for the CA channel 405.

In some cases, the parity bit 450 or DSF signaling 440 may provide an indication of a comparison between parity bits (e.g., between a parity bit generated by the memory device 110 and a parity bit received by the memory device 110) for one or more previous write operations, such as described with reference to at least one of timing diagrams 300-a and 300-b. For example, a register of the memory device may store a result of one or more write operations (e.g., logging a detected parity mismatch on the CA channel 405 for any of the write operations), and the register value may be indicated using parity bit 450 or DSF signaling 440. The register value may be reset (e.g., the parity error cleared) upon outputting the parity bit 450, or the register value may not be reset upon outputting the parity bit 450, and clearing the parity error of the register may be performed using a register write operation from the host via additional signaling (not shown). The portion of the DSF signaling corresponding to the indication may span one or more time intervals 447 of the burst.

In some cases, the memory device 110 may generate parity bit 450 based on the read command 425 and may transmit the generated parity bit 450 to the host device 105 in the unused time interval 447-a. Upon receiving the generated parity bit 450, the host device 105 may compare an internally generated parity bit with the received parity bit 450. If the two parity bits match, the host device 105 may determine that the read command 425 was received correctly by the memory device 110. However, if the two parity bits do not match, the host device 105 may determine that the read command 425 was not correctly received by the memory device 110. In cases where a first portion of the read command 425 is received over a first subset of the set of pins associated with CA channel 405 for receiving a command and a second portion of the read command 425 is received over a second subset of the set of pins associated with CA channel 405 for receiving an address, the parity bit 450 may be for the first portion of the read command 425, the second portion of the read command 425, or both.

Link ECC may be enabled for the timing diagrams 400-a and 400-b as depicted for FIGS. 4A and 4B. Timing diagrams 400-a and 400-b may differ in that the DSF signaling for FIG. 4A may be of a first type (e.g., DSF+ as defined in Joint Electronic Device Engineering Council (JEDEC) standards) and the DSF signaling of FIG. 4B may be of a second type (e.g., DSF as defined in JEDEC standards).

In some cases, as demonstrated in FIG. 4C, the multi-purpose channel may not carry the data ECC 445 (e.g., due to link ECC being disabled). However, the multi-purpose channel may be used for other functions (e.g., for DMI signaling when the memory device 110 receives a write command). Additionally, in such cases, an unused time interval 447-a may still be present. In such cases, the memory device 110 may transmit the parity bit 450 for the read command 425 as described herein.

If a write clock (WCK) mode is enabled and CA parity is enabled, the memory device 110 may apply one or more special restrictions to CA parity. For instance, CA parity during read operations may not be performed.

The methods as described herein may also apply to non-read or non-write command cases. For instance, during a non-read command (e.g., a command that is not a read command 425), RDQS_t of an RDQS channel may act as a parity input (e.g., for carrying a parity bit from the host device 105 to the memory device 110) and RDQS_c of an RDQS channel may act as a parity output (e.g., for carrying a parity bit from the memory device 110 to the host device 105). In some such cases, the CA parity error may be signaled during reads (e.g., on a DMI channel). The CA parity error may be signaled if command and address of parity occurrence is logged. During non-read and non-write commands, parity signal width may be longer as compared to read commands 425 and/or write command 325.

Figure 5:
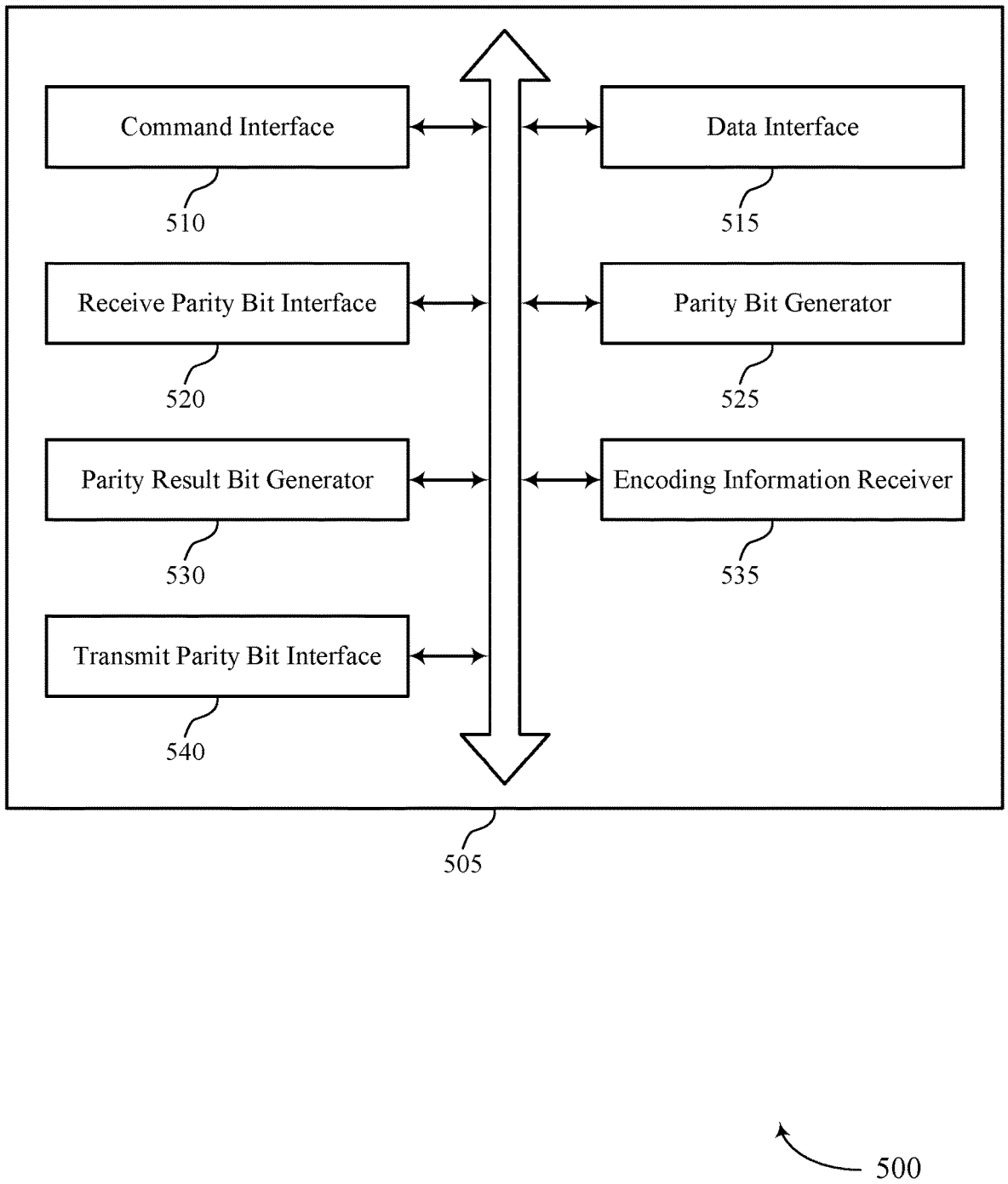
FIG. 5 shows a block diagram of a memory device that supports targeted command/address parity low lift in accordance with examples as disclosed herein.

FIG. 5 shows a block diagram 500 of a memory device 505 that supports targeted command/address parity low lift in accordance with examples as disclosed herein. The memory device 505 may be an example of aspects of a memory device as described with reference to FIGS. 1 and 2. The memory device 505 may include a command interface 510, a data interface 515, a receive parity bit interface 520, a parity bit generator 525, a parity result bit generator 530, an encoding information receiver 535, and a transmit parity bit interface 540. Each of these modules may communicate, directly or indirectly, with one another (e.g., via one or more buses).

The command interface 510 may receive a write command from a host device via a first set of pins. The command interface 510 may receive a read command from the host device via the first set of pins. In some cases, a first portion of the write command is received over a first subset of the first set of pins for receiving a command and where a second portion of the write command is received over a second subset of the first set of pins for receiving an address, and where the first parity bit is for the first portion of the write command, the second portion of the write command, or both. In some cases, a first portion of the read command is received over a first subset of the first set of pins for receiving a command and where a second portion of the read command is received over a second subset of the first set of pins for receiving an address, and where the parity bit is for the first portion of the read command, the second portion of the read command, or both.

The data interface 515 may receive data from the host device during a set of time intervals via a second set of pins based on receiving the write command. The data interface 515 may transmit data to the host device during a set of time intervals via the second set of pins based on receiving the read command. In some cases, each time interval of the set of time intervals is a cycle or a portion of a cycle of a clock signal.

The receive parity bit interface 520 may receive a first parity bit associated with the write command via a third set of pins during a first time interval of the set of time intervals, where the third set of pins is used to receive at least one additional bit associated with the write command during at least one time interval of the set of time intervals. The receive parity bit interface 520 may receive an error correction code for the data including the at least one additional bit via the third set of pins during a second time interval of the set of time intervals. The receive parity bit interface 520 may receive a second error correction code via the third set of pins for the encoding information during a third time interval of the set of time intervals. The receive parity bit interface 520 may transmit a redundant data strobe signal via the third set of pins based on receiving the read command. In some cases, the first parity bit is received prior to the second error correction code. In some cases, the first parity bit is received prior to the error correction code for the data.

The parity bit generator 525 may generate a second parity bit based on the write command. The parity bit generator 525 may generate a parity bit based on the read command.

The parity result bit generator 530 may generate a parity result bit based on comparing the first parity bit and the second parity bit.

The encoding information receiver 535 may receive encoding information via a fourth set of pins for the data during the first time interval.

The transmit parity bit interface 540 may transmit the parity bit associated with the read command via a third set of pins during a first time interval of the set of time intervals, where the third set of pins is used to transmit at least one additional bit associated with the read command during at least one time interval of the set of time intervals. The transmit parity bit interface 540 may transmit an error correction code for the data including the at least one additional bit via the third set of pins during a second time interval of the set of time intervals. The transmit parity bit interface 540 may transmit an indication of a data set function via the third set of pins during a third time interval of the set of time intervals. The transmit parity bit interface 540 may receive a data mask signal via the third set of pins based on receiving the write command. In some cases, the parity bit is transmitted prior to transmitting the error correction code for the data. In some cases, the parity bit is transmitted prior to transmitting the indication of the data set function.

Figure 6:
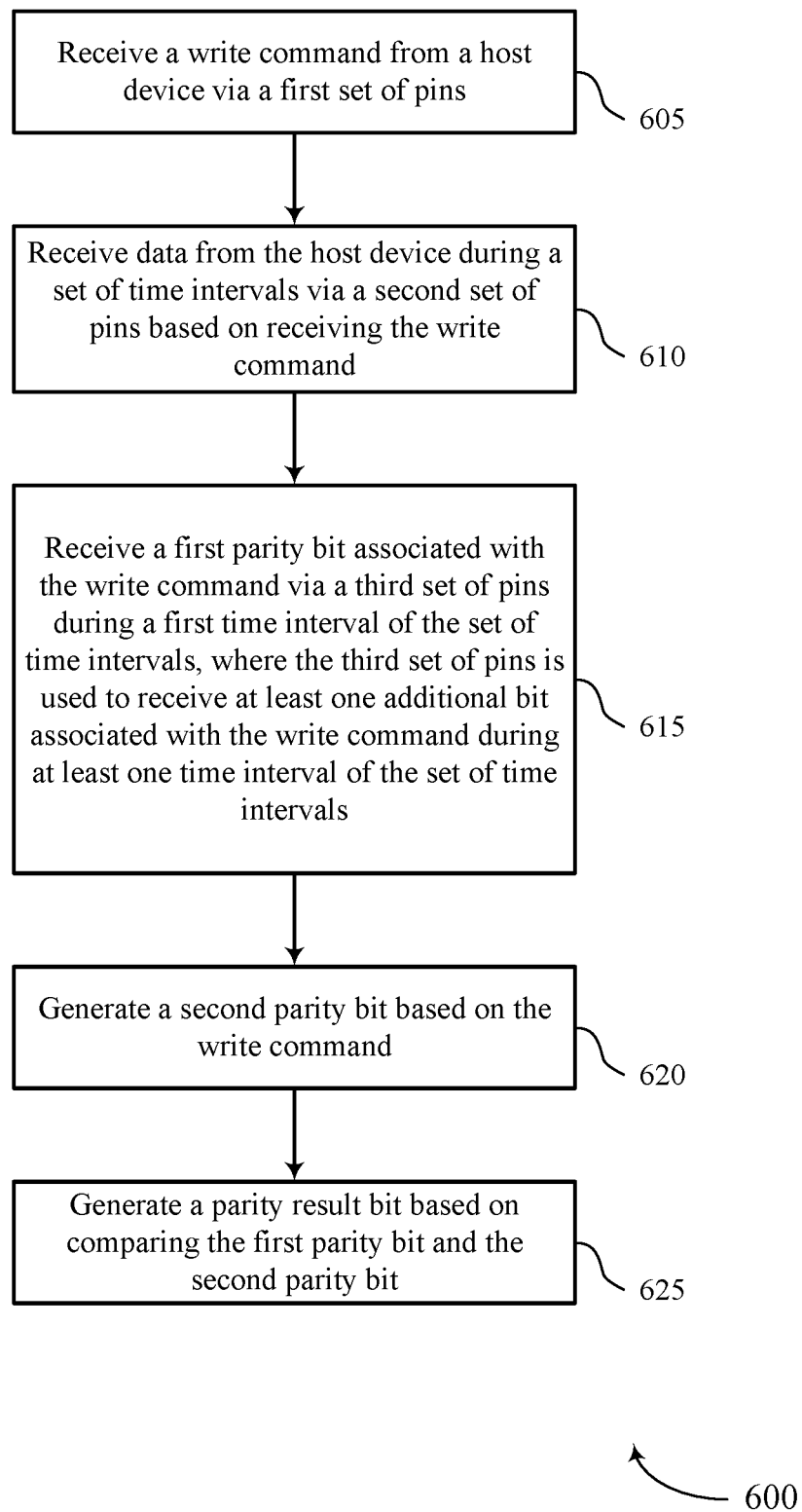
FIGS. 6 and 7 show flowcharts illustrating a method or methods for targeted command/address parity low lift in accordance with examples as disclosed herein.

FIG. 6 shows a flowchart illustrating a method or methods 600 that supports targeted command/address parity low lift in accordance with examples as disclosed herein. The operations of method 600 may be implemented by a memory device 110 or its components as described herein. For example, the operations of method 600 may be performed by a memory device as described with reference to FIG. 5. A memory device may execute a set of instructions to control the functional elements of the memory device to perform the described functions. Additionally or alternatively, a memory device may perform aspects of the described functions using special-purpose hardware.

At 605, the memory device may receive a write command from a host device via a first set of pins. The operations of 605 may be performed according to the methods described herein. Aspects of the operations of 605 may be performed by a command interface as described with reference to FIG. 5.

At 610, the memory device may receive data from the host device during a set of time intervals via a second set of pins based on receiving the write command. The operations of 610 may be performed according to the methods described herein. Aspects of the operations of 610 may be performed by a data interface as described with reference to FIG. 5.

At 615, the memory device may receive a first parity bit associated with the write command via a third set of pins during a first time interval of the set of time intervals, where the third set of pins is used to receive at least one additional bit associated with the write command during at least one time interval of the set of time intervals. The operations of 615 may be performed according to the methods described herein. Aspects of the operations of 615 may be performed by a receive parity bit interface as described with reference to FIG. 5.

At 620, the memory device may generate a second parity bit based on the write command. The operations of 620 may be performed according to the methods described herein. Aspects of the operations of 620 may be performed by a parity bit generator as described with reference to FIG. 5.

At 625, the memory device may generate a parity result bit based on comparing the first parity bit and the second parity bit. The operations of 625 may be performed according to the methods described herein. Aspects of the operations of 625 may be performed by a parity result bit generator as described with reference to FIG. 5.

An apparatus as described herein may perform a method or methods, such as the method 600. The apparatus may include features, means, or instructions (e.g., a non-transitory computer-readable medium storing instructions executable by a processor) for receiving a write command from a host device via a first set of pins, receiving data from the host device during a set of time intervals via a second set of pins based on receiving the write command, receiving a first parity bit associated with the write command via a third set of pins during a first time interval of the set of time intervals, where the third set of pins is used to receive at least one additional bit associated with the write command during at least one time interval of the set of time intervals, generating a second parity bit based on the write command, and generating a parity result bit based on comparing the first parity bit and the second parity bit.

Some examples of the method 600 and the apparatus described herein may further include operations, features, means, or instructions for receiving an error correction code for the data including the at least one additional bit via the third set of pins during a second time interval of the set of time intervals.

Some examples of the method 600 and the apparatus described herein may further include operations, features, means, or instructions for receiving encoding information via a fourth set of pins for the data during the first time interval, and receiving a second error correction code via the third set of pins for the encoding information during a third time interval of the set of time intervals.

In some examples of the method 600 and the apparatus described herein, the first parity bit may be received prior to the second error correction code.

In some examples of the method 600 and the apparatus described herein, the first parity bit may be received prior to the error correction code for the data.

Some examples of the method 600 and the apparatus described herein may further include operations, features, means, or instructions for receiving a read command from the host device via the first set of pins, and transmitting the parity result bit to the host device via the third set of pins based on receiving the read command.

Some examples of the method 600 and the apparatus described herein may further include operations, features, means, or instructions for receiving a read command from the host device via the first set of pins, and transmitting a redundant data strobe signal via the third set of pins based on receiving the read command.

In some examples of the method 600 and the apparatus described herein, each time interval of the set of time intervals may be a cycle or a portion of a cycle of a clock signal.

In some examples of the method 600 and the apparatus described herein, a first portion of the write command may be received over a first subset of the first set of pins for receiving a command and where a second portion of the write command may be received over a second subset of the first set of pins for receiving an address, and where the first parity bit may be for the first portion of the write command, the second portion of the write command, or both.

Figure 7:
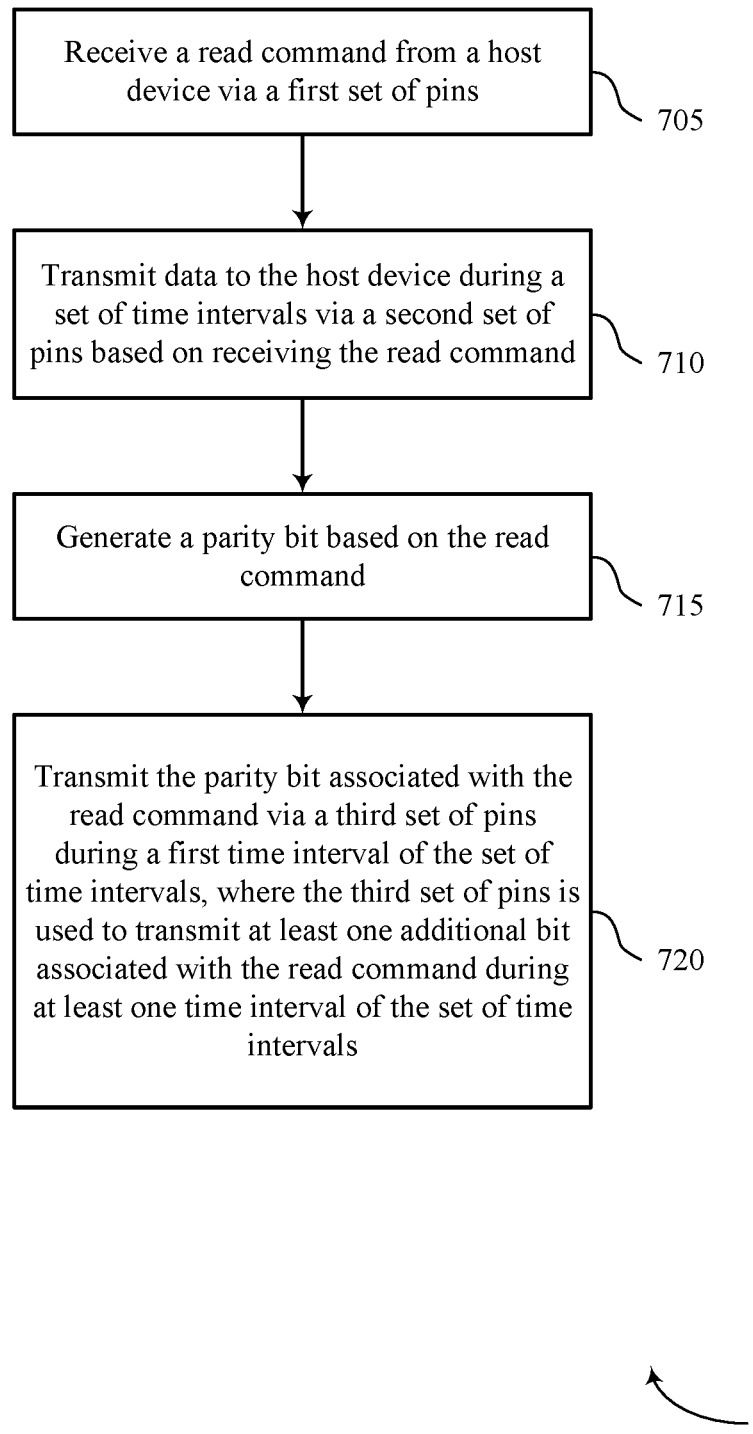

FIG. 7 shows a flowchart illustrating a method or methods 700 that supports targeted command/address parity low lift in accordance with examples as disclosed herein. The operations of method 700 may be implemented by a memory device 110 or its components as described herein. For example, the operations of method 700 may be performed by a memory device as described with reference to FIG. 5. A memory device may execute a set of instructions to control the functional elements of the memory device to perform the described functions. Additionally or alternatively, a memory device may perform aspects of the described functions using special-purpose hardware.

At 705, the memory device may receive a read command from a host device via a first set of pins. The operations of 705 may be performed according to the methods described herein. Aspects of the operations of 705 may be performed by a command interface as described with reference to FIG. 5.

At 710, the memory device may transmit data to the host device during a set of time intervals via a second set of pins based on receiving the read command. The operations of 710 may be performed according to the methods described herein. Aspects of the operations of 710 may be performed by a data interface as described with reference to FIG. 5.

At 715, the memory device may generate a parity bit based on the read command. The operations of 715 may be performed according to the methods described herein. Aspects of the operations of 715 may be performed by a parity bit generator as described with reference to FIG. 5.

At 720, the memory device may transmit the parity bit associated with the read command via a third set of pins during a first time interval of the set of time intervals, where the third set of pins is used to transmit at least one additional bit associated with the read command during at least one time interval of the set of time intervals. The operations of 720 may be performed according to the methods described herein. Aspects of the operations of 720 may be performed by a transmit parity bit interface as described with reference to FIG. 5.

An apparatus as described herein may perform a method or methods, such as the method 700. The apparatus may include features, means, or instructions (e.g., a non-transitory computer-readable medium storing instructions executable by a processor) for receiving a read command from a host device via a first set of pins, transmitting data to the host device during a set of time intervals via a second set of pins based on receiving the read command, generating a parity bit based on the read command, and transmitting the parity bit associated with the read command via a third set of pins during a first time interval of the set of time intervals, where the third set of pins is used to transmit at least one additional bit associated with the read command during at least one time interval of the set of time intervals.

Some examples of the method 700 and the apparatus described herein may further include operations, features, means, or instructions for transmitting an error correction code for the data including the at least one additional bit via the third set of pins during a second time interval of the set of time intervals.

In some examples of the method 700 and the apparatus described herein, the parity bit may be transmitted prior to transmitting the error correction code for the data.

Some examples of the method 700 and the apparatus described herein may further include operations, features, means, or instructions for transmitting an indication of a data set function via the third set of pins during a third time interval of the set of time intervals.

In some examples of the method 700 and the apparatus described herein, the parity bit may be transmitted prior to transmitting the indication of the data set function.

Some examples of the method 700 and the apparatus described herein may further include operations, features, means, or instructions for receiving a write command from the host device via the first set of pins, and receiving a data mask signal via the third set of pins based on receiving the write command.

In some examples of the method 700 and the apparatus described herein, a first portion of the read command may be received over a first subset of the first set of pins for receiving a command and where a second portion of the read command may be received over a second subset of the first set of pins for receiving an address, and where the parity bit may be for the first portion of the read command, the second portion of the read command, or both.

A memory device is described. The memory device includes a first set of pins configured to receive a command from the host device, a second set of pins configured to perform data transfer with the host device during a set of time intervals, and a third set of pins configured to exchange a parity bit associated with the command with the host device during a first time interval of the set of time intervals, and where the third set of pins is further configured to exchange at least one additional bit associated with the command with the host device during at least one time interval of the set of time intervals.

The third set of pins may be further configured to exchange an error correction code for the data including the at least one additional bi with the host device during a second time interval of the set of time intervals. The parity bit may be exchanged with the host device prior to exchanging the error correction code. The memory device may further include a fourth set of pins configured to exchange encoding information for the data with the host device during the first time interval of the set of time intervals.

In some examples, the command is a write command, and the third set of pins is configured to receive the parity bit based on the command being the write command. In some examples, the command is a read command the third set of pins is configured to transmit the parity bit based on the command being the read command. In some examples, the memory device is DRAM.

It should be noted that the methods described above describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. The flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
receiving a write command from a host device via a first set of pins;
receiving data and a first parity bit associated with the write command via a second set of pins;
generating a second parity bit based at least in part on the write command; and
generating a parity result bit based at least in part on the first parity bit and the second parity bit.

2. The method of claim 1, further comprising:
comparing the first parity bit and the second parity bit based at least in part on generating the second parity bit, wherein generating the parity result bit is based at least in part on comparing the first parity bit and the second parity bit.

3. The method of claim 2, further comprising:
determining a match between the first parity bit and the second parity bit based at least in part on comparing the first parity bit and the second parity bit; and
determining that the write command was received correctly based at least in part on the match between the first parity bit and the second parity bit.

4. The method of claim 3, further comprising:
storing an indication of the match between the first parity bit and the second parity bit based at least in part on determining that the write command was received correctly.

5. The method of claim 2, further comprising:
determining a mismatch between the first parity bit and the second parity bit based at least in part on comparing the first parity bit and the second parity bit; and
determining that the write command was received incorrectly based at least in part on determining the mismatch between the first parity bit and the second parity bit.

6. The method of claim 5, further comprising:
storing an indication of the mismatch between the first parity bit and the second parity bit based at least in part on determining that the write command was received incorrectly.

7. The method of claim 1, further comprising:
receiving data from the host device during one or more time intervals based at least in part on receiving the write command, wherein receiving the first parity bit is based at least in part on receiving the data.

8. The method of claim 7, wherein the first parity bit is received via a third set of pins during a first time interval of the one or more time intervals.

9. The method of claim 7, further comprising:
receiving, via a third set of pins, at least one additional bit associated with the write command during at least one time interval of the one or more time intervals.

10. The method of claim 1, wherein receiving the write command further comprises:
receiving a first portion of the write command via a first one or more of a first set of pins; and
receiving a second portion of the write command via a second one or more of the first set of pins, wherein the first parity bit is included the first portion of the write command, the second portion of the write command, or both.

11. A method, comprising:
receiving a read command from a host device via a first set of pins;
transmitting data to the host device based at least in part on receiving the read command via a second set of pins;
generating a parity bit based at least in part on the read command; and
transmitting the parity bit associated with the read command and based at least in part on generating the parity bit.

12. The method of claim 11, further comprising:
transmitting the data to the host device during one or more time intervals via a second set of pins based at least in part on receiving the read command.

13. The method of claim 12, wherein the parity bit is transmitted via a third set of pins during a first time interval of the one or more time intervals.

14. The method of claim 12, further comprising:
transmitting, via a third set of pins, at least one additional bit associated with the read command during at least one time interval of the one or more time intervals.

15. The method of claim 11, wherein receiving the read command further comprises:
receiving a first portion of the read command via a first one or more of a first set of pins; and
receiving a second portion of the read command via a second one or more of the first set of pins.

16. The method of claim 11, further comprising:
storing an indication of a comparison between the parity bit and a second parity bit based at least in part on generating the parity bit.

17. A memory device, comprising:
a first set of pins configured to receive a command from a host device;
a second set of pins configured to perform data transfer with the host device; and
a third set of pins configured to communicate, with the host device, a parity bit associated with the command and at least one additional bit associated with the command.

18. The memory device of claim 17, wherein the data transfer is performed during one or more time intervals, and wherein the parity bit is communicated with the host device during a first time interval of the one or more time intervals.

19. The memory device of claim 17, wherein the data transfer is performed during one or more time intervals, and wherein the at least one additional bit is communicated with the host device during at least one time interval of the one or more time intervals.

20. The memory device of claim 17, further comprising:
a register coupled with at least the first set of pins and configured to store an indication of a comparison between the parity bit associated with the command and a second parity bit.

* * * * *